United States Patent
Kim et al.

(10) Patent No.: US 9,966,548 B2
(45) Date of Patent: May 8, 2018

(54) CONDUCTIVE POLYMER INK COMPOSITION AND ORGANIC SOLAR CELL INCLUDING THE SAME

(71) Applicant: LG CHEM, LTD., Seoul (KR)

(72) Inventors: Mi-Kyoung Kim, Daejeon (KR);
Jae-Hyun Yoo, Daejeon (KR);
Joon-Hyung Kim, Daejeon (KR);
Jie-Hyun Seong, Daejeon (KR);
Hang-Ken Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days. days.

(21) Appl. No.: 14/010,218

(22) Filed: Aug. 26, 2013

(65) Prior Publication Data

US 2014/0000700 A1    Jan. 2, 2014

Related U.S. Application Data

(63) Continuation of application No. PCT/KR2013/004194, filed on May 10, 2013.

(30) Foreign Application Priority Data

May 11, 2012  (KR) .......... 10-2012-0050503
May 10, 2013  (KR) .......... 10-2013-0053405

(51) Int. Cl.
*H01L 51/44* (2006.01)
*C09D 11/10* (2014.01)
*C09D 11/38* (2014.01)
*C09D 11/52* (2014.01)
*H01L 51/00* (2006.01)

(52) U.S. Cl.
CPC ............ *H01L 51/441* (2013.01); *C09D 11/10* (2013.01); *C09D 11/38* (2013.01); *C09D 11/52* (2013.01); *H01L 51/442* (2013.01); *H01L 51/0005* (2013.01); *H01L 51/0007* (2013.01); *H01L 51/0037* (2013.01); *Y02E 10/549* (2013.01)

(58) Field of Classification Search
CPC .... H01B 1/04; H01B 1/20; H01B 1/24; H01L 51/441; H01L 51/0021; H01L 51/442; H01L 51/0005; H01L 51/0007; H01L 51/0037; C09D 11/10; C09D 11/38; C09D 11/52; Y02E 10/549
USPC ................. 136/263; 251/500, 510
See application file for complete search history.

(56) References Cited

U.S. PATENT DOCUMENTS

| | | | |
|---|---|---|---|
| 2005/0040372 A1* | 2/2005 | Tahon et al. | 252/500 |
| 2007/0079869 A1* | 4/2007 | Yukinobu | 136/263 |
| 2010/0085319 A1 | 4/2010 | Hayashi et al. | |
| 2011/0248223 A1* | 10/2011 | Zheng | 252/519.21 |
| 2011/0310053 A1* | 12/2011 | Kim et al. | 345/174 |

FOREIGN PATENT DOCUMENTS

| | | |
|---|---|---|
| JP | 2009-245935 A | 10/2009 |
| JP | 2009245935 A | 10/2009 |
| JP | 2010-114066 A | 5/2010 |
| JP | 2010103106 A | 5/2010 |
| JP | 2010114066 A | 5/2010 |
| JP | 2010165900 A | 7/2010 |
| JP | 2010170829 A | 8/2010 |
| KR | 1020090112894 A | 10/2009 |

OTHER PUBLICATIONS

Sigma, Sigma Product Information Sheet, Triton X-100TM.*

* cited by examiner

*Primary Examiner* — Matthew T Martin
*Assistant Examiner* — Dujuan A Horton
(74) *Attorney, Agent, or Firm* — Dentons US LLP

(57) ABSTRACT

Provided are a conductive polymer ink composition including a) a water-based dispersion including a conductive polymer, b) a conductivity enhancer, c) a solvent, and d) a fluorine-based surfactant and a surfactant having a hydrophile-lipophile balance (HLB) of 12 or above, and an organic solar cell including the same.

4 Claims, No Drawings

CONDUCTIVE POLYMER INK COMPOSITION AND ORGANIC SOLAR CELL INCLUDING THE SAME

CROSS-REFERENCE TO RELATED APPLICATIONS

This application is a Continuation Bypass Application of International Patent Application No. PCT/KR2013/004194, filed May 10, 2013, and claims the benefit of Korean Patent Application Nos. 10-2012-0050503 filed on May 11, 2012, and 10-2013-0053405 filed on May 10, 2013, in the Korean Intellectual Property Office, the disclosure of which are incorporated herein by reference.

BACKGROUND OF THE INVENTION

Field of the Invention

The present invention relates to a conductive polymer ink composition and an organic solar cell including the same.

Description of the Related Art

Research into conductive polymers having various applications such as fuel cells, solar cells, displays, actuators, electrostatic shields, electromagnetic shields, and conductive coatings has been actively undertaken.

In particular, a significant amount of research into replacing an indium tin oxide (ITO) layer with a conductive polymer has been undertaken in organic solar cells which have been prominent as a replacement energy sources in the era of high oil prices.

With respect to an ITO layer used as a transparent electrode in a typical organic solar cell, since a thin film is formed using a vacuum deposition method, there have been many limitations in terms of a glass transition temperature, a substrate size, and a layer thickness, in the case that the ITO layer is used on a flexible substrate. Also, the ITO layer may be easily delaminated due to rigidity thereof in the case that the flexible substrate is bent, and productivity may be relatively low.

A method of using graphene having a high degree of conductivity and transparency has been proposed in order to replace the ITO layer. However, with respect to the graphene, a sintering temperature thereof may be relatively high, at 1000° C. or more, and the graphene may be difficult to form across a relatively large area.

In contrast, with respect to the conductive polymer, a transparent electrode having a relatively large area may be easily and quickly prepared, because there may be no limitation on the selection of a substrate, a heat treatment temperature may be low, and a solution process may be possible. Therefore, research into using a conductive polymer as a transparent electrode for replacing an ITO layer, a transparent electrode material of an organic solar cell, has recently been actively conducted.

In general, in the case that an organic solar cell is formed across a relatively large area, it is important that the organic solar cell is realized at a low cost. For this purpose, a printing method, such as spray coating, gravure offset printing, inkjet printing, or screen printing, is mainly considered instead of typically used spin coating.

In particular, since a method of using inkjet printing may form a pattern in a desired area by using a small amount of a material and digital patterning may be possible without using a separate negative plate, productivity may be improved in the case that an organic solar cell is formed across a relatively large area. Also, it is also important that the patterning be completed in a short period of time in order to prepare the organic solar cell having a large area, wherein this may be satisfied if the inkjet printing method is used. Therefore, research into methods of using inkjet printing in a process of preparing an organic solar cell has recently been actively undertaken.

However, in the case in which a conductive polymer is used in inkjet printing, since the surface tension of the conductive polymer is high, the conductive polymer may be difficult to be used as it is for inkjet printing. Jetting may be possible if a surfactant is added to overcome the above limitation, but the spreadability of an ink may not be sufficient, and thus, a line may be disconnected during the formation of a line pattern. Also, in the case that an organic solvent having low surface tension is added in order to address the above limitation, jetting properties may deteriorate or the conductivity of a solution may decrease. Therefore, with respect to inkjet compositions using conductive polymers developed so far, the spreadability thereof may be low and the surface tension thereof may be high, and thus, the inkjet compositions may not be suitable for a process of preparing an organic solar cell by using an inkjet printing method.

Therefore, development of a conductive polymer ink composition having excellent coating properties of a photoactive layer as well as facilitating the formation of a transparent electrode able to replace a typical ITO layer during the preparation of an organic solar cell due to excellent spreadability is urgently required.

SUMMARY OF THE INVENTION

An aspect of the present invention provides a conductive polymer ink composition able to form a transparent electrode having high transparency and conductivity as well as facilitating coating of a photoactive layer, and an organic solar cell including the same.

According to an aspect of the present invention, there is provided a conductive polymer ink composition including: a) a water-based dispersion including a conductive polymer; b) a conductivity enhancer; c) a solvent; and d) a fluorine-based surfactant and a surfactant having a hydrophile-lipophile balance (HLB) of 12 or above.

According to another aspect of the present invention, there is provided an organic solar cell including: a substrate; a first electrode formed on the substrate; a photoactive layer formed on the first electrode; a second electrode formed on the photoactive layer, wherein the first electrode is formed by including the conductive polymer ink composition according to the present invention.

DETAILED DESCRIPTION OF THE PREFERRED EMBODIMENT

Hereinafter, preferred embodiments of the present invention will be described. The invention may, however, be embodied in many different forms and should not be construed as being limited to the embodiments set forth herein; rather, these embodiments are provided so that this disclosure will be thorough and complete, and will fully convey the concept of the invention to those skilled in the art.

A conductive polymer ink composition according to the present invention includes: a) a water-based dispersion including a conductive polymer; b) a conductivity enhancer; c) a solvent; and d) a fluorine-based surfactant and a surfactant having a hydrophile-lipophile balance (HLB) of 12 or above.

As a result of a significant amount of research conducted into developing a conductive polymer ink composition suitable for an organic solar cell, the present inventors recognized that spreadability and surface tension characteristics of a conductive polymer ink composition are significantly improved in the case in which a fluorine-based surfactant and a surfactant having a HLB of 12 or above are mixed and used, thereby leading to completion of the present invention.

Hereinafter, components of the conductive polymer ink composition of the present invention will be described in detail.

In the present invention, the water-based dispersion including a conductive polymer may be used without limitation so long as it is well known in the art. For example, a well-known commercial product of the water-based dispersion including a conductive polymer may be PH-1000® by Heraeus, GmbH. A content of the conductive polymer in the water-based dispersion may be in a range of 0.5 parts by weight to 2 parts by weight or 1 part by weight to 1.5 parts by weight, based on 100 parts by weight of the water-based dispersion. Herein, the content of the conductive polymer denotes a solid content.

The conductive polymer functions to provide conductivity to the conductive ink composition, in which a typical conductive polymer known in the art may be used. For example, one or more selected from the group consisting of conductive polymers, such as polyacetylenes, polyphenylenevinylenes, polyaniline, polypyrrols, polythiophenes, and polythiophene vinylenes, may be used. However, the present invention is not limited thereto. The above conductive polymers may be less expensive than metals or metal particles, may have excellent fluidity, and may be transparent.

In particular, with respect to the conductive polymer ink composition according to the present invention, the conductive polymer may be poly(3,4-ethylenedioxythiophene (PEDOT):poly(styrenesulfonate) (PSS) or a derivative thereof in consideration of conductivity and thermal stability.

A content of a) the water-based dispersion including a conductive polymer may be in a range of 10 parts by weight to 80 parts by weight, 15 parts by weight to 65 parts by weight, or 20 parts by weight to 50 parts by weight, based on 100 parts by weight of a total ink composition. In the case that the content of the water-based dispersion including a conductive polymer satisfies the above range, securement of conductivity and transparency may be facilitated. The preferred content of the conductive polymer is in a range from 0.05 to 1.6 parts by weight, based on 100 parts by weight of the total conductive polymer ink composition. These lower and upper limits are readily calculated when the minimum and maximum amounts of water-based dispersion and conductive polymer therein are considered. See [0019 and 0022].

Next, b) the conductivity enhancer improves conductivity, in which any conductivity enhancer well known in the art may be used without limitation. For example, one or more selected from the group consisting of dimethylsulfoxide (DMSO), N,N-dimethylformamide (DMF), and tetrahydrofuran (THF) may be used. A content of the conductivity enhancer, for example, may be in a range of 0.3 parts by weight to 5 parts by weight, 0.5 parts by weight to 4 parts by weight, or 0.7 parts by weight to 3 parts by weight, based on 100 parts by weight of the total conductive polymer ink composition. In the case in which the content of the conductivity enhancer satisfies the above range, an effect of improving the conductivity of a layer formed by using the conductive polymer ink composition according to the present invention may be relatively excellent.

The solvent is for controlling viscosity and physical properties of the ink composition, in which any solvent may be used without limitation so long as it may be well mixed with the conductive polymer, and, for example, the solvent may be a mixture of water and an organic solvent. A content ratio of the water to the organic solvent may be in a range of 40:60 to 90:10 or 50:50 to 80:20. In the case that the content ratio of the water to the organic solvent satisfies the above range, dispersibility and conductivity of the ink may be excellent, and coating and jetting properties may be improved. Thus, the ink composition may be suitable for an inkjet process.

More particularly, the organic solvent, for example, may include i) glycol ethers and ii) polyhydric alcohols. That is, in the present invention, the solvent may be a mixed solvent of water, i) glycol ethers, and ii) polyhydric alcohols. In the case that the mixed solvent of water, i) glycol ethers, and ii) polyhydric alcohols is used as the solvent, jetting properties and spreadability thereof may be improved, and thus, the ink composition may be more suitable for an inkjet process.

The glycol ethers function to decrease volatility of the ink and improve jetting properties and spreadability, in which a boiling point thereof may be in a range of 150° C. to 300° C. In the case in which the boiling point of i) the glycol ethers satisfies the above range, drying of the ink at a nozzle end may be prevented, and thus, jetting may be facilitated. Also, the ink may not be immediately dried, but may spread on a substrate, and thus, the disconnection of a line in the middle of the formation of a pattern may be prevented.

More particularly, examples of i) the glycol ethers may be one or more selected from the group consisting of ethylene glycol monobutyl ether, diethylene glycol monobutyl ether, diethylene glycol monoethyl ether, diethylene glycol methyl ether, diethylene glycol monobutyl ether acetate, and diethylene glycol monoethyl ether acetate. However, the present invention is not limited thereto.

The polyhydric alcohols function to improve dispersibility of the conductive polymer and to maintain conductivity, and examples of the polyhydric alcohols may be one or more selected from the group consisting of propylene glycol, diethylene glycol, ethylene glycol, erythritol, glycerol, and sorbitol. In particular, in the present invention, ii) the polyhydric alcohols may be one or more selected from the group consisting of propylene glycol, glycerol, and diethylene glycol, in terms of further improving conductivity.

If necessary, the organic solvent, for example, may further include iii) cyclohexanone in order to adjust the viscosity of the ink composition and to maintain dispersion stability. That is, in the present invention, the solvent may be a mixed solvent of water, i) glycol ethers, and ii) polyhydric alcohols, and may further selectively include iii) cyclohexanone.

In general, since the conductive polymer dispersion is dispersed in water, the surface tension of the solution is high, and thus, the solution may be difficult to be used as it is for inkjet printing. Even in the case in which jetting may be possible, spreadability of the ink may not be sufficient, and thus, the disconnection of a line in the middle of the formation of a pattern may occur. If an organic solvent having low surface tension is added in order to address the above limitation, jetting properties may deteriorate or the conductivity of the solution may decrease. However, as in the conductive polymer ink composition according to the present invention, in the case that water and the organic solvent are included as the solvent and the mixed solvent of i) and ii) or the mixed solvent of i), ii), and iii) is used as the organic solvent, jetting properties and spreadability are excellent, and thus, the ink composition may be suitable for an inkjet process and may form a conductive polymer layer having excellent conductivity.

A total content of c) the solvent may be in a range of 35 parts by weight to 89 parts by weight, 40 parts by weight to 83 parts by weight, or 45 parts by weight to 78 parts by weight, based on 100 parts by weight of the total conductive polymer ink composition.

Also, the organic solvent included in the solvent, for example, may include i) 5 parts by weight to 95 parts by weight of the glycol ethers and ii) 5 parts by weight to 95 parts by weight of the polyhydric alcohols, based on 100 parts by weight of the organic solvent. Furthermore, the organic solvent, for example, may also include i) 10 parts by weight to 50 parts by weight of the glycol ethers, ii) 5 parts by weight to 80 parts by weight of the polyhydric alcohols, and iii) greater than 0 to 10 parts by weight or less of the cyclohexanone, based on 100 parts by weight of the organic solvent. For example, a content of iii) the cyclohexanone may be in a range of 2 parts by weight to 8 parts by weight.

The conductive polymer ink composition according to the present invention may include a fluorine-based surfactant and a surfactant having a HLB of 12 or above. Herein, the fluorine-based surfactant is not particularly limited so long as it includes fluorine. Also, the surfactant limiting the HLB is not particularly limited so long as a value of the HLB is 12 or above. However, in the ink composition according to the present invention, the surfactant having a HLB of 12 or above may be more desirable than a surfactant having a HLB of 13 or more. The reason for this is that since the surfactant having a HLB of 12 or above is included, surface energy of a conductive polymer layer formed by using the ink composition according to the present invention is high, and thus, coating of the photoactive layer coated on the conductive polymer layer may be more facilitated.

In the present specification, the HLB denotes a ratio of a hydrophilic portion to a lipophilic portion of the surfactant. In the present specification, the HLB may be calculated by a method well known in the art, and for example, may be calculated by using Equations 1 to 4 below. In general, a value of the HLB is within a range of 0 to 20, and it is denoted that the higher the HLB value is the higher the hydrophilicity is and the lower the HLB value is the higher the lipophilicity is.

$$HLB = 20 \times \frac{\text{molecular weight of hydrophilic portion}}{\text{molecular weight of surfactant}} \quad \text{[Equation 1]}$$

$$HLB = \frac{\text{wt \% of hydrophilic group}}{5} \quad \text{[Equation 2]}$$

$$HLB = 20 \times \left(1 - \frac{\text{safonification value of polyhydric alcohol ester}}{\text{acid value of fatty acid}}\right) \quad \text{[Equation 3]}$$

$$HLB = \frac{\text{wt \% of oxyethylene chain} + \text{wt \% of polyhydric alcohol}}{5} \quad \text{[Equation 4]}$$

Equation 1 defined by Griffin may derive HLB of a typical nonionic surfactant. Also, Equation 2 may apply to a polyoxyethylene glycol-based surfactant, and in this case, the HLB may be obtained by substituting wt % of a polyoxyethylene glycol portion with wt % of a hydrophilic group. Equation 3 may be used when deriving HLB of a polyhydric alcohol fatty acid ester-based surfactant, and Equation 4 may be used for a material which can not be hydrolyzed.

In the conductive polymer ink composition according to the present invention, the fluorine-based surfactant may be a compound including a perfluoroalkyl group ($C_nF_{2n+1}$—) in a main chain or a side chain of a compound including a hydrophilic group or a lipophilic group. Herein, the compound including a hydrophilic group or a lipophilic group includes all compounds in the form of a polymer or an oligomer. In the present invention, a commercial product may be used as the fluorine-based surfactant, and for example, one or more selected from the group consisting of F-550®, F-552®, F-553®, F-554®, F-555®, F-478®, F-444®, and F-479®, which are manufactured by DIC Corporation, may be used. However, the present invention is not limited thereto.

A content of the fluorine-based surfactant may be in a range of 0.01 parts by weight to 0.1 parts by weight, 0.03 parts by weight to 0.08 parts by weight, or 0.04 parts by weight to 0.07 parts by weight, based on 100 parts by weight of the total conductive polymer ink composition. The fluorine-based surfactant controls jetting properties by adjusting the surface tension of the ink, and may easily form a conductive polymer layer on a substrate of an organic solar cell, more particularly, even on a substrate having a metal mesh pattern formed thereon, by further improving spreadability.

Also, the surfactant having a HLB of 12 or above, for example, may be a surfactant including one or more structures selected from the group consisting of a random copolymer of ethylene oxide and propylene oxide, a block copolymer of ethylene oxide and propylene oxide, alkyl polyglycol ether, polyoxyethylene alkyl ether, a polyoxyethylene fatty acid ester, polyoxyethylene alkyl phenol ether, a sorbitan fatty acid ester, a polyoxyethylene sorbitan fatty acid ester, a sucrose fatty acid ester, acetylene glycol, and polyoxyethylene. However, the present invention is not limited thereto. In particular, in the present invention, the surfactant having a HLB of 12 or above, for example, may include a structure of acetylene glycol and/or polyoxyethylene. The reason for this is that the surface energy of a conductive polymer layer formed by using the ink composition according to the present invention may be increased to thus further improve the coating properties of the photoactive layer.

More particularly, the surfactant including the structure of acetylene glycol, for example, may be expressed by Chemical Formula 1 below, and the surfactant including the structure of polyoxyethylene, for example, may be expressed by Chemical Formula 2 below.

[Chemical Formula 1]

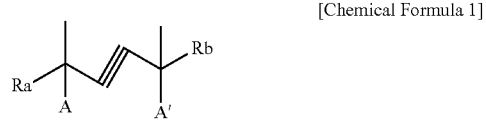

In which, $R_a$ and $R_b$ are respectively selected from the group consisting of hydrogen and an alkyl group having a carbon number of 1 to 12, A is —[OCH$_2$CH$_2$]$_m$—OH, A' is —[OCH$_2$CH$_2$]$_n$—OH, and m and n are each integers between 1 and 80.

[Chemical Formula 2]

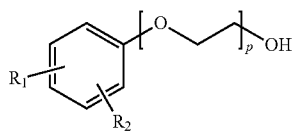

In which, $R_1$ and $R_2$ are respectively selected from the group consisting of hydrogen and an alkyl group having a carbon number of 1 to 12, at least one of $R_1$ and $R_2$ includes the alkyl group having a carbon number of 1 to 12, and p is an integer between 1 and 200.

In the present invention, a commercial product may be used as the surfactant including the structure of acetylene glycol, and for example, one or more selected from the group consisting of Surfynol 420®, Surfynol 465®, Surfynol 485®, Surfynol 104E®, and Dynol 604® by Air Products and Chemicals, Inc. may be used. However, the present invention is not limited thereto.

Also, a commercial product may be used as the surfactant including the structure of polyoxyethylene, and for example, one or more selected from the group consisting of IGEPAL CO-630®, IGEPAL CO-890®, and IGEPAL DM-970® by Aldrich may be used. However, the present invention is not limited thereto.

A content of the surfactant having a HLB of 12 or above may be in a range of 0.3 parts by weight to 1.5 parts by weight, or 0.5 parts by weight to 1.2 parts by weight, or 0.6 parts by weight to 1.0 part by weight, based on 100 parts by weight of the total ink composition. In the case that the content of the surfactant having a HLB of 12 or above satisfies the above range, an organic solar cell device may be efficiently fabricated while not affecting the conductivity of the ink layer.

In particular, in the conductive polymer ink composition according to the present invention, the fluorine-based surfactant may be added in an amount smaller than that of the surfactant having a HLB of 12 or above, in order to secure jetting properties suitable for an inkjet printing process and obtain a conductive polymer ink composition having excellent coating properties and conductivity. More particularly, a weight ratio of the fluorine-based surfactant to the surfactant having a HLB of 12 or above, for example, may be in a range of 1:2 to 1:30 or 1:4 to 1:25. In the case in which the weight ratio of the fluorine-based surfactant to the surfactant having a HLB of 12 or above satisfies the above range, coating properties, jetting properties, and spreadability may be excellent, and thus, the ink composition may be more suitable for an inkjet printing process and a desired conductive polymer layer may be formed.

The ink composition according to the present invention may improve the spreadability of the ink composition as well as the surface energy of the conductive polymer layer by including two kinds of the surfactants as described above, and thus, the ink composition may be suitable for a transparent electrode for replacing a typical indium tin oxide (ITO) layer formed by using an inkjet process in an organic solar cell.

A surface tension of the conductive polymer ink composition according to the present invention may be in a range of 15 mN/m to 45 mN/m or 20 mN/m to 40 mN/m. In the case that the surface tension of the conductive polymer ink composition satisfies the above range, jetting may be facilitated when the ink is introduced into an inkjet head. In the present specification, the surface tension denotes a value measured by using a ring method.

Also, a viscosity of the conductive polymer ink composition according to the present invention may be in a range of 5 cP to 20 cP or 8 cP to 18 cP. In the case in which the viscosity of the conductive polymer ink composition satisfies the above range, ink may be stably discharged.

The conductive polymer ink composition according to the present invention having the foregoing configuration has excellent jetting properties and spreadability, and thus, may be suitable for an inkjet process. Also, in the case that an electrode is formed by using the conductive polymer ink composition, a transparent electrode having high transparency and conductivity may be formed.

Any method well known in the art may be used as a method of preparing the conductive polymer ink composition according to the present invention without limitation. For example, the conductive polymer ink composition according to the present invention may be prepared by mixing a) a water-based dispersion including a conductive polymer, b) a conductivity enhancer, c) a solvent, and d) a fluorine-based surfactant and a surfactant having a HLB of 12 or above by a known method.

Next, an organic solar cell according to the present invention will be described.

The organic solar cell according to the present invention includes a substrate; a first electrode formed on the substrate; a photoactive layer formed on the first electrode; a second electrode formed on the photoactive layer, wherein the first electrode is formed by including the conductive polymer ink composition according to the present invention.

The organic solar cell may be prepared by a method well known in the art, and for example, the method may be performed by including 1) forming a first electrode on a substrate, 2) forming a photoactive layer on the first electrode, and 3) forming a second electrode on the photoactive layer.

Also, external light, such as sunlight, may be incident on the substrate, in which any substrate well known in the art may be used without limitation. However, the substrate may be a glass substrate or a plastic substrate. Specific examples of the plastic substrate may be poly(ethylene terephthalate) (PET), poly(ethylene naphthalate) (PEN), poly carbonate (PC), polypropylene (PP), polyimide (PI), or triacetyl cellulose (TAC).

The first electrode may be formed by patterning with the conductive polymer ink composition according to the present invention instead of using a typical ITO layer. The patterning may be performed by using an inkjet process. Also, the first electrode may selectively include a metal mesh.

As described above, in the case that the first electrode included in the organic solar cell is formed by using the conductive polymer ink composition according to the present invention, since the spreadability thereof is excellent, the formation of the transparent electrode is facilitated. In particular, patterning may be facilitated even on a substrate having a metal mesh pattern formed thereon.

Also, since a conductive polymer layer formed by using the conductive polymer ink composition according to the present invention may have a high degree of surface energy, coating properties of a photoactive layer may be excellent, and thus, the preparation of the organic solar cell may be facilitated.

The photoactive layer may use a D/A bi-layer structure or a composite thin film ((D+A) blend, bulk heterojunction) structure of an electron donor (D) material and an electron acceptor (A) material having a thickness of about 100 nm to about 400 nm. The photoactive layer may include a p-type conductive polymer material including π-electrons as the electron donor and a conductive polymer-electron acceptor blend layer including fullerene or a derivative thereof as the electron acceptor.

Specific examples of the p-type conductive polymer used as the electron donor may be poly(3-hexylthiophene) (P3HT), polysiloxane carbazole, polyaniline, polyethylene oxide, poly(1-methoxy-4-(0-Disperse Red1)-2,5-phenylene-vinylene), polyindole, polycarbazole, polypyridiazine, polyisothianaphthalene, polyphenylene sulfide, polyvinylpyridine, polythiophene, polyfluorene, polypyridine, and a derivative thereof. However, the present invention is not limited thereto. The p-type conductive polymer may be a combination of two or more materials.

Specific examples of the electron acceptor may include fullerene or a derivative thereof, nanocrystals such as CdSe, carbon nanotubes, nanorods, or nanowires. However, the present invention is not limited thereto.

The photoactive layer may be formed of a mixture of P3HT as an electron donor and PCBM, [6,6]-phenyl-C61 butyric acid methyl ester ($PC_{61}BM$), or $PC_{71}BM$, a fullerene derivative, as an electron acceptor. A mixing weight ratio therebetween may be in a range of 1:0.1 to 1:4.

A material having a low work function may be used as the second electrode in order for the electron injection into the photoactive layer to be facilitated. Metal, such as aluminum, magnesium, calcium, sodium, potassium, indium, yttrium, lithium, silver, lead, and cesium, or a combination of two or more thereof may be used as the material of the second electrode. However, the present invention is not limited thereto. For example, aluminum (Al) may be used as the second electrode.

An intermediate layer may be selectively included between the photoactive layer and the second electrode layer, and the intermediate layer, for example, may be a layer including LiF. The intermediate layer is for preventing the damage to the photoactive layer during the formation of the second layer, in which the intermediate layer may be formed by using a method well known in the art.

Example 1

1.6 parts by weight of DMSO was added to 30.6 parts by weight of a water-based dispersion including 1 part by weight of a solid content of PEDOT:PSS, a conductive polymer, based on 100 parts by weight of an ink composition and mixed for about 2 hours. Then, 66.75 parts by weight of a solvent, in which water:i) diethylene glycol monobutyl ether:ii) propylene glycol were mixed at a ratio of 5:2:3, 0.05 parts by weight of a fluorine-based surfactant, and 1.0 part by weight of a surfactant having a HLB of 12 or above were further added thereto and mixed for 4 hours to prepare a conductive polymer ink composition. CLEVIOS PH-1000 by Heraeus GmbH was used as the water-based dispersion including PEDOT:PSS, a conductive polymer.

Examples 2 and 3 and Comparative Examples 1 to 4

Ink compositions were prepared in the same manner as Example 1 according to components and contents listed in Table 1 below.

TABLE 1

| Category | Water-based dispersion (PH-1000) | DMSO | Solvent (water:i):ii) = 5:2:3) | Surfactant Fluorine-based (F-555) | HLB value |
|---|---|---|---|---|---|
| Example 1 | 30.6 | 1.6 | 66.75 | 0.05 | Surfynol 465(HLB 13) 1.0 |
| Example 2 | 31.1 | 1.65 | 66.7 | 0.05 | Surfynol 485(HLB 17) 0.5 |
| Example 3 | 31.0 | 1.6 | 67.0 | 0.05 | IGEPAL CO-890 (HLB 17) 0.37 |
| Comparative Example 1 | 32.8 | 1.64 | 65.5 | 0.05 | — |
| Comparative Example 2 | 30.6 | 1.6 | 66.75 | 0.05 | Surfynol 420(HLB 4) 1.0 |
| Comparative Example 3 | 30.6 | 1.6 | 66.75 | 0.05 | Dynol 604(HLB 9.6) 1.0 |
| Comparative Example 4 | 30.6 | 1.6 | 66.8 | — | Surfynol 465(HLB 13) 1.0 |

In which, a unit representing the content of each component is parts by weight, based on 100 parts by weight of the total polymer ink composition.

Experimental Examples (1) Contact Angle

Contact angles were measured using the ink compositions according to Examples 1 to 3 and Comparative Examples 1 to 4. CB contact angles were measured in such a manner that the ink compositions were spin coated on glass substrates, ink layers were then formed by drying the ink compositions on a hot plate at 120° C. for 30 minutes, and chlorobenzene (CB), a solvent used for dissolving an active material, was dropped on the ink layers. Also, ink contact angles were measured by dropping the ink compositions on a glass substrate. The measurements were performed by using a contact angle measuring system (DSA 100) by KRÜSS, GmbH. The results thereof are presented in Table 2.

A high contact angle denotes poor spreadability and a low contact angle denotes good spreadability. That is, a lower CB contact angle denoted that coating properties of the solution (P3HT:PCBM blend solution) having the active material dissolved therein was better, and a lower ink contact angle denoted that the spreadability of the ink was better.

(2) Sheet Resistance Measurement

Sheet resistances were measured using the ink compositions according to Examples 1 to 3 and Comparative Examples 1 to 4. Ink layers were formed by drying the ink compositions on a hot plate at 120° C. for 30 minutes after the ink compositions were spin coated, and the sheet resistances thereof were then measured by using a 4-point probe (MCP-T600, MITSUBISHI CHEMICAL Co.). The results thereof are presented in Table 2. A low sheet resistance denoted good conductivity, and a high sheet resistance denoted poor conductivity.

(3) Transmittance

Transmittance levels were measured using the ink compositions according to Examples 1 to 3 and Comparative Examples 1 to 4. Ink layers were formed by drying the ink compositions on a hot plate at 120° C. for 30 minutes after the ink compositions were spin coated, and the transmittance levels thereof were then measured by using a transmittance measuring instrument (400, NIPPON DENSHOKU). The results thereof are presented in Table 2. The measured transmittance values included a value of the transmittance of the glass substrate.

(4) Jetting Properties

Jetting properties were measured using the ink compositions according to Examples 1 to 3 and Comparative Examples 1 to 4. Jetting properties were measured by using an inkjet printer (DMO 2800) by FUJIFILM Dimatix, Inc., and the jetting properties thereof were evaluated by the following criteria. The results thereof are presented in Table 2.

A case that good jetting was continuously performed: O
A case that good jetting was initially obtained, but no discharge occurred as time elapsed: Δ
A case that jetting was initially poor: ×

TABLE 2

| Category | Contact angle | | Sheet resistance (Ω/square) | Transmittance (%) | Jetting properties | Coating properties |
| --- | --- | --- | --- | --- | --- | --- |
| | CB contact angle | Ink contact angle | | | | |
| Example 1 | 3.4 | 5.3 | $2.49 \times 10^2$ | 89.0 | O | O |
| Example 2 | 5.2 | 5.7 | $2.47 \times 10^2$ | 88.6 | O | O |
| Example 3 | 4.4 | 6.0 | $2.48 \times 10^2$ | 87.7 | O | O |
| Comparative Example 1 | 54.2 | 5.5 | $3.00 \times 10^2$ | 88.9 | O | X |
| Comparative Example 2 | 49.7 | 5.4 | $2.72 \times 10^2$ | 88.9 | O | X |
| Comparative Example 3 | 48.1 | 5.1 | $2.75 \times 10^2$ | 88.3 | O | X |
| Comparative Example 4 | 4.8 | 2.0** | $3.01 \times 10^2$ | 89.1 | Δ | X |

**An initial contact angle was low, but an ink drop, which had been spread, soon contracted.

As illustrated in Table 2, with respect to Examples 1 to 3, the conductive polymer ink compositions according to the present invention, it may be understood that both of the CB contact angle and the ink contact angle were low and thus, the spreadability and coating properties of the polymer materials for forming a photoactive layer were excellent. Also, sheet resistances and jetting properties were also excellent.

However, with respect to Comparative Examples 1 to 3, since the CB contact angles were high, coating of the polymer materials for forming a photoactive layer was not facilitated. With respect to Comparative Example 4, the ink contact angle was low, but a phenomenon occurred, in which an ink drop was introduced and the ink drop then contracted within 1 second to 5 seconds. Therefore, with respect to the ink compositions according to Comparative Examples 1 to 4, it may be understood that the ink compositions were not suitable for forming the first electrode of an organic solar cell as well as an inkjet process.

Since a conductive polymer ink composition according to the present invention may form a conductive polymer layer having a high degree of surface energy, coating of a photoactive layer may be facilitated during the preparation of an organic solar cell.

Also, since the conductive polymer ink composition according to the present invention has excellent spreadability, patterning may be facilitated. In particular, since the patterning even on a substrate having a metal mesh pattern formed thereon may be facilitated, the conductive polymer ink composition may be suitable for the formation of a transparent electrode for replacing a typical ITO layer in an organic solar cell.

Since the conductive polymer ink composition according to the present invention has excellent jetting properties, the conductive polymer ink composition may be suitable for an inkjet process and may form a transparent electrode having high transparency and conductivity.

While the present invention has been shown and described in connection with the exemplary embodiments, it will be apparent to those skilled in the art that modifications and variations can be made without departing from the spirit and scope of the invention as defined by the appended claims.

What is claimed is:

1. A conductive polymer ink composition consisting essentially of:
    a) a water-based dispersion including a conductive polymer;
    b) a conductivity enhancer;
    c) a solvent; and
    d) a fluorine-based surfactant and a surfactant having a hydrophile-lipophile balance (HLB) of 12 or above, wherein the fluorine-based surfactant comprises a perfluoroalkyl group in a main chain of a compound including a hydrophilic group or a lipophilic group;

wherein the surfactant having a hydrophile-lipophile balance (HLB) of 12 or above is a surfactant comprising the structure of polyoxyethylene expressed by Chemical Formula 2 below, wherein a weight ratio of the fluorine-based surfactant to the surfactant having a HLB of 12 or above is within a range of 1:2 to 1:30, wherein the solvent comprises water and an organic solvent, and the organic solvent comprises i) glycol ethers and ii) polyhydric alcohols, and wherein a ratio of the water to the organic solvent is within a range of 40:60 to 90:10, wherein the conductive polymer ink composition, based on 100 parts by weight of a total conductive polymer ink composition, consists essentially of a) 10 to 80 parts by weight of the water-based dispersion including a conductive polymer, b) 0.3 to 5 parts by weight of the conductivity enhancer, c) 35 to 89 parts by weight of the solvent, and d) 0.01 to 0.1 parts by weight of the fluorine-based surfactant and 0.3 to 1.5 parts by weight of the surfactant having a HLB of 12 or above, and wherein a content of the conductive polymer in the water-based dispersion is in a range from 0.5 to 2 parts by weight based on 100 parts by weight of the water-based dispersion, and wherein a content of the conductive polymer in the total conductive ink composition is in a range from 0.05 to 1.6 parts by weight based on 100 parts by weight of the total conductive polymer ink composition,

[Chemical Formula 2]

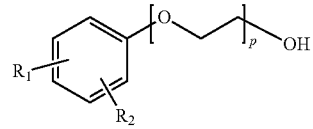

where $R_1$ and $R_2$ are respectively selected from the group consisting of hydrogen and an alkyl group having a carbon number of 1 to 12, at least one of $R_1$ and $R_2$ includes the alkyl group having a carbon number of 1 to 12, and p is an integer between 1 and 200.

2. The conductive polymer ink composition of claim 1, wherein the organic solvent comprises i) 5 parts by weight to 95 parts by weight of the glycol ethers and ii) 5 parts by weight to 95 parts by weight of the polyhydric alcohols, based on 100 parts by weight of the organic solvent.

3. The conductive polymer ink composition of claim 1, wherein the organic solvent further comprises iii) cyclohexanone.

4. The conductive polymer ink composition of claim 3, wherein the organic solvent comprises i) 10 parts by weight to 50 parts by weight of the glycol ethers, ii) 5 parts by weight to 80 parts by weight of the polyhydric alcohols, and iii) greater than 0 to 10 parts by weight or less of the cyclohexanone, based on 100 parts by weight of the organic solvent.

* * * * *